US009245832B2

(12) United States Patent
Hasegawa et al.

(10) Patent No.: US 9,245,832 B2
(45) Date of Patent: Jan. 26, 2016

(54) SEMICONDUCTOR MODULE (71) Applicant: FUJI ELECTRIC CO., LTD., Kawasaki-shi (JP)

(72) Inventors: Akane Hasegawa, Kawasaki (JP); Kenji Okamoto, Hachioji (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/512,368

(22) Filed: Oct. 10, 2014

(65) Prior Publication Data

US 2015/0028462 A1 Jan. 29, 2015

Related U.S. Application Data

(63) Continuation of application No. PCT/JP2013/004300, filed on Jul. 11, 2013.

(30) Foreign Application Priority Data

Jul. 17, 2012 (JP) .................................. 2012-158288

(51) Int. Cl.
*H01L 23/02* (2006.01)
*H01L 23/48* (2006.01)
(Continued)

(52) U.S. Cl.
CPC .......... *H01L 23/49568* (2013.01); *H01L 23/36* (2013.01); *H01L 23/3731* (2013.01); *H01L 23/4334* (2013.01); *H01L 23/4952* (2013.01); *H01L 23/49555* (2013.01); *H01L 23/49562* (2013.01); *H01L 23/49575* (2013.01); *H01L 24/48* (2013.01); *H01L 23/295* (2013.01); *H01L 23/3107* (2013.01); *H01L 23/3735* (2013.01); *H01L 24/29* (2013.01); *H01L 24/32* (2013.01); 
(Continued)

(58) Field of Classification Search
CPC ..................... H01L 23/49568; H01L 23/4952; H01L 23/3731; H01L 23/49562; H01L 24/48
USPC ................. 257/666, 675, 678, 690, 693, 700; 438/106, 109, 111, 121–123
See application file for complete search history.

(56) References Cited

U.S. PATENT DOCUMENTS

| 8,754,510 B2 * | 6/2014 | Minamio et al. ............... 257/674 |
| 2011/0044009 A1 * | 2/2011 | Fukuda et al. ................ 361/720 |

FOREIGN PATENT DOCUMENTS

| JP | S55-36915 A | 3/1980 |
| JP | H05-109940 A | 4/1993 |

(Continued)

OTHER PUBLICATIONS

Japanese Office Action dated Nov. 25, 2015.

*Primary Examiner* — Hsien Ming Lee
(74) *Attorney, Agent, or Firm* — Rabin & Berdo, P.C.

(57) ABSTRACT

A semiconductor module includes: a metal block; an insulation layer for heat radiation formed by directly depositing a ceramic material on at least a first surface of the metal block; an insulation layer for a relay electrode formed by directly depositing a ceramic material on a part of a second surface 1*b* of the metal block; a relay electrode formed by depositing a metal material on the upper surface of the insulation layer for the relay electrode; a circuit element bonded with the second surface of the metal block by solder; and an external lead terminal, wherein a bonding wire or a lead frame from the circuit element is bonded with the relay electrode, and the relay electrode and the external lead terminal are connected.

19 Claims, 9 Drawing Sheets

(51) Int. Cl.
   *H01L 21/44*   (2006.01)
   *H01L 21/48*   (2006.01)
   *H01L 23/495*  (2006.01)
   *H01L 23/433*  (2006.01)
   *H01L 23/373*  (2006.01)
   *H01L 23/36*   (2006.01)
   *H01L 23/29*    (2006.01)
   *H01L 23/31*    (2006.01)
   *H01L 23/00*    (2006.01)

(52) U.S. Cl.
   CPC .............. *H01L 24/40* (2013.01); *H01L 24/45* (2013.01); *H01L 24/73* (2013.01); *H01L 24/83* (2013.01); *H01L 24/84* (2013.01); *H01L 24/85* (2013.01); *H01L 24/92* (2013.01); *H01L 2224/29111* (2013.01); *H01L 2224/32245* (2013.01); *H01L 2224/40249* (2013.01); *H01L 2224/45015* (2013.01); *H01L 2224/45124* (2013.01); *H01L 2224/48137* (2013.01); *H01L 2224/48249* (2013.01); *H01L 2224/48747* (2013.01); *H01L 2224/48847* (2013.01); *H01L 2224/73263* (2013.01); *H01L 2224/73265* (2013.01); *H01L 2224/83065* (2013.01); *H01L 2224/84447* (2013.01); *H01L 2224/85205* (2013.01); *H01L 2224/85447* (2013.01); *H01L 2224/92246* (2013.01); *H01L 2224/92247* (2013.01); *H01L 2924/014* (2013.01); *H01L 2924/1305* (2013.01); *H01L 2924/13055* (2013.01); *H01L 2924/14* (2013.01); *H01L 2924/15747* (2013.01); *H01L 2924/15787* (2013.01); *H01L 2924/181* (2013.01); *H01L 2924/19107* (2013.01)

(56) References Cited

FOREIGN PATENT DOCUMENTS

| | | |
|---|---|---|
| JP | H09-139461 A | 5/1997 |
| JP | H09-275676 A | 10/1997 |
| JP | 2000-156439 A | 6/2000 |
| JP | 2007-305772 A | 11/2007 |
| JP | 2011-114010 A | 6/2011 |

* cited by examiner

SEMICONDUCTOR MODULE

This application is a continuation under 35 U.S.C. 120 of International Application PCT/JP2013/004300 having the International Filing Date of Jul. 11, 2013, and having the benefit of the earlier filing date of Japanese Application No. 2012-158288, filed Jul. 17, 2012. All of the identified applications are fully incorporated herein by reference.

TECHNICAL FIELD

The present invention relates to a semiconductor module on which a circuit element, such as a power semiconductor element, is mounted.

BACKGROUND ART

A semiconductor module used for a power supply apparatus is widely applied for such consumer appliances as home air conditioners and refrigerators to such industrial equipment as inverters and servo controllers. To conserve power consumption in a semiconductor module, a power semiconductor element or the like is mounted on a circuit board, such as a metal base substrate or ceramic substrate. A semiconductor module is configured by mounting one or a plurality of circuit element(s) such as a power semiconductor element on a circuit board, adhering a plastic case frame and sealing with a silicone gel or epoxy resin.

On the other hand, a full mold semiconductor module made by a transfer molding method is used to reduce manufacturing cost (e.g. see Patent Document 1, identified further on). In a full mold semiconductor module, a lead frame and a heat sink are securely connected so as to ensure electric insulation.

Figure 7:
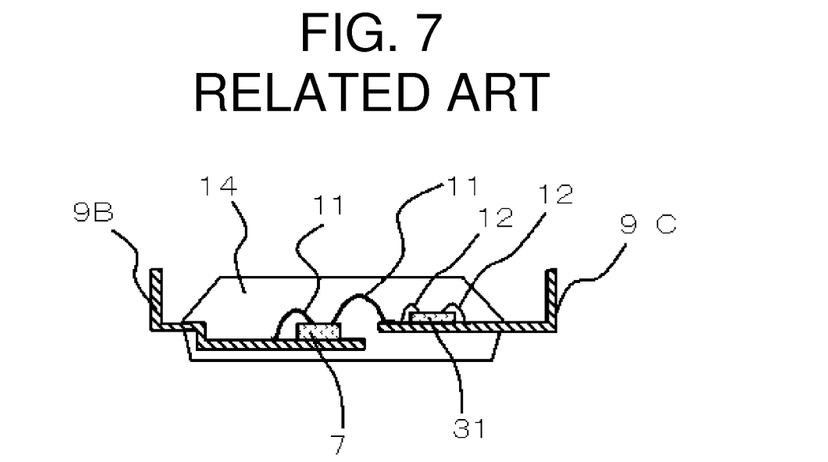
FIG. 7 is a cross-sectional view depicting a first example of a semiconductor module according to the related art.

FIG. 7 shows a first example of a conventional full mode semiconductor module. A power semiconductor element 7 and a drive IC 31 are mounted on lead frames 9B and 9C for external connection respectively, and are interconnected by bonding wires 11 and 12. These components are set in a metal mold and molding resin 14 is filled in, whereby the full mode semiconductor module is configured.

Figure 8:
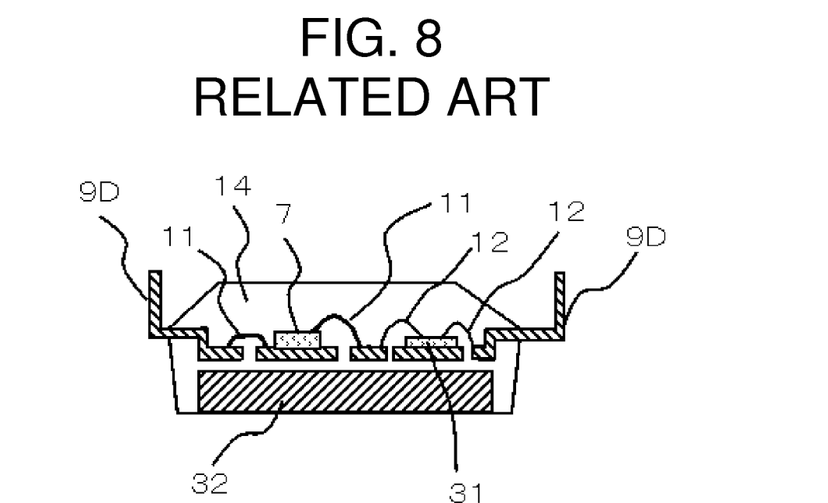
FIG. 8 is a cross-sectional view depicting a second example of the semiconductor module according to the related art.

FIG. 8 shows a second example of a conventional full mode semiconductor module. In addition to the full mode semiconductor module illustrated in FIG. 7, a heat sink 32 is also disposed. The power semiconductor element 7 and the drive IC 31 are interconnected by the bonding wires 11 and 12, and the bonding wire 11 from the power semiconductor element 7 is bonded with a lead frame 9D for external connection.

Figure 9:
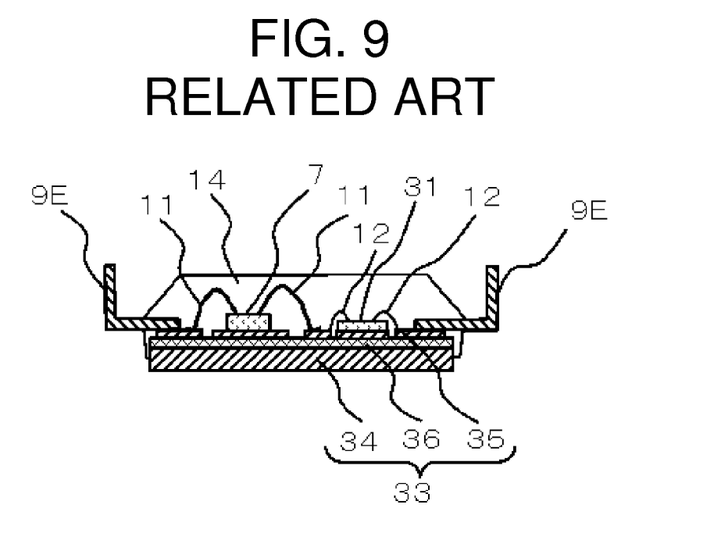
FIG. 9 is a cross-sectional view depicting a third example of the semiconductor module according to the related art.

FIG. 9 shows a third example of a conventional full mode semiconductor module. In the third example, an insulation substrate 33, which has the dual functions of an insulation layer and a heatsink, is included. For the insulation substrate 33, as illustrated in the figure, a metal base substrate constituted by a metal plate 34 and a copper foil 35, which are stacked via the insulation layer 36 made of resin, or a DBC (Direct Bond Copper) substrate of which insulation layer 36 is made of ceramic, for example, is used. The power semiconductor element 7 and the drive IC 31 are interconnected by bonding wires 11 and 12, and the power semiconductor element 7 is connected to a lead frame 9E for external connection via a bonding wire 11 and the copper foil 35.

Figure 10:
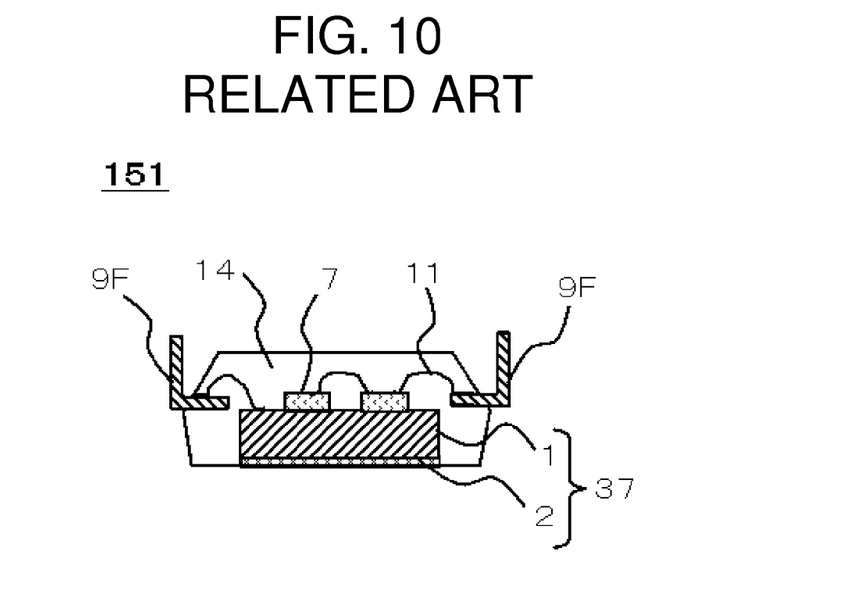
FIG. 10 is a cross-sectional view depicting a fourth example of the semiconductor module according to the related art.

FIG. 10 shows a fourth example of a conventional full mold semiconductor module. In the fourth example, an insulation metal block 37, where an insulation layer 2 is formed by spraying ceramic on one side of a metal block 1, is used instead of the insulation substrate 33 in FIG. 9. Since the power semiconductor element 7 is directly bonded with the metal block 1, some full mode semiconductor modules of this type have better coolability than the third example type. A bonding wire 11 from the power semiconductor element 7 is bonded with a lead frame 9F for external connection.

Patent Document 1: Japanese Patent Application Laid-open No. H9-139461 (paragraph number 0038, FIG. 1)

In the case of the conventional full mode semiconductor modules of the first to fourth examples, the bonding wire 11 is directly bonded to the power semiconductor element 7 and the other end of the bonding wire 11 is bonded to an external lead terminal, such as the lead frame 9B for external connection, and current is supplied from the external lead terminal, therefore heat generated when the power semiconductor element 7 is operating is conducted to the bonding wire 11 and the external lead terminal, which heats an external printed circuit board connected with the external lead terminal.

If the printed circuit board is heated, temperature inside a case of a power converter, such as an inverter, which houses the printed circuit board, increases, exceeding the heat resistance temperature of members in the power converter. This temperature increase could be handled by an air cooling or a water cooling method, but if either method were used the dimensions of the power converter would increase, which results in a cost increase. Therefore it is necessary to effectively control the temperature increase inside the case of the power converter without increasing the dimensions and cost of the power converter, and as one such countermeasure, it is demanded to effectively control heat that is conducted from the semiconductor module to the external printed circuit board via the external lead terminals.

SUMMARY

With the foregoing in view, it is an object of the present invention to provide a semiconductor module having a superb heat radiation performance that can efficiently control the heat conducted to the external printed circuit board via the external lead terminals, so as to meet the above mentioned demand for a countermeasure to control the temperature increase inside the power converter.

To achieve the object, a semiconductor module of the present invention includes: a metal block that has a first surface and a second surface; an insulation layer for heat radiation formed by directly depositing a ceramic material on at least the first surface of the metal block; an insulation layer for a relay electrode, formed by directly depositing a ceramic material on a part of the second surface of the metal block; a relay electrode formed by depositing a metal material on an upper surface of the insulation layer for the relay electrode; a circuit element bonded with the second surface of the metal block; and an external lead terminal, wherein a bonding wire or a lead frame from the circuit element is bonded with the relay electrode, and the relay electrode and the external lead terminal are connected.

According to this configuration, the bonding wire or the lead frame from the circuit element is bonded with the relay electrode, and the relay electrode and the external lead terminal are connected, whereby the circuit element and the external lead terminal are connected via the relay electrode.

Therefore heat that is generated when a circuit element, such as a power semiconductor element, is operating and transferred through the bonding wire or the lead frame, is conducted to the metal block, which has a high heat capacity and is superb in heat radiation performance, mainly via the relay electrode and the insulation layer for the relay electrode made of a ceramic material, hence the quantity of heat conducted to the external lead terminal can be sufficiently controlled.

As a consequence, according to the semiconductor module of the present invention, the quantity of heat that is conducted from the external lead terminal to the printed circuit board, for example, which is externally connected to the external lead termina, can be effectively controlled, and as a result the heating of the external printed circuit board can be effectively controlled.

It can be configured that the insulation layer for heat radiation covers at least a part of side surfaces connected to the first surface of the metal block.

It can also be configured that the insulation layer for heat radiation and the insulation layer for the relay electrode each have a thermal conductivity of 1 to 200 W/m·K and a thickness of 10 to 500 μm.

It can be configured that the insulation layer for heat radiation and the insulation layer for the relay electrode are each formed of at least one type out of a filler group consisting of silicon oxide, aluminum oxide, silicon nitride, aluminum nitride and boron nitride, and it can be configured that the insulation layer for heat radiation and the insulation layer for the relay electrode are each formed by depositing ceramic particles composed of at least one type out of the filler group by a plasma spraying method, or that the insulation layer for heat radiation and the insulation layer for the relay electrode are each formed by depositing ceramic particles composed of at least one type out of the filler group by an aerosol deposition method.

It can be configured that the relay electrode is formed by spraying copper particles as the metal material.

It can also be configured that the relay electrode and the external lead terminal are connected via a bonding wire or a lead frame.

It can be configured that the circuit element is a power semiconductor element.

According to this invention, heat that is generated when a circuit element, such as a power semiconductor element, is operating in the semiconductor module and is transferred through the bonding wire or the lead frame from the circuit element, is conducted to the metal block, which has a high heat capacity and is superb in heat radiation performance, mainly via the relay electrode and the insulation layer for the relay electrode made of a ceramic material, hence the quantity of heat conducted to the external lead terminal can be sufficiently controlled.

As a consequence, according to the present invention, the quantity of heat that is conducted from the external lead terminal to the printed circuit board, for example, which is externally connected to the external lead terminal, can be effectively controlled, and therefore the heating of the external printed circuit board can be effectively controlled.

This means that the semiconductor module according to the present invention is suitable for effectively controlling an increase in temperature inside the case of the power converter without increasing the dimensions and cost of the power converter.

DETAILED DESCRIPTION

Embodiments of the present invention will now be described with reference to the drawings. The present invention is not limited to the following embodiments, but modifications can be made within a scope that does not depart from the true spirit of the invention. In the following description with reference to the drawings, same portions or elements are denoted with a same reference symbol, unless otherwise specified.

Figure 1A:
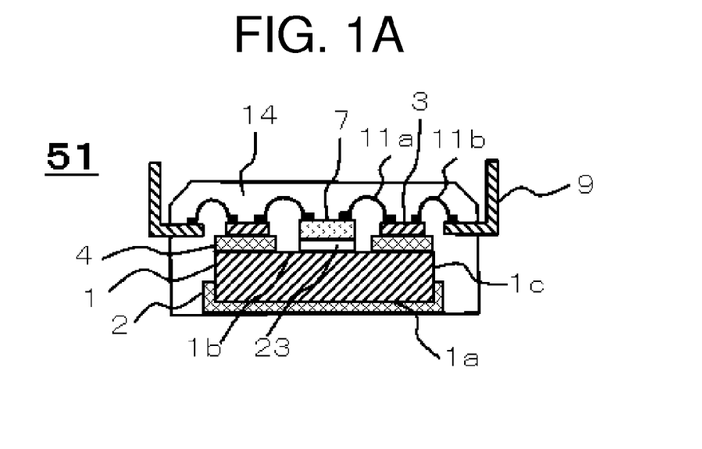
FIGS. 1A, 1B and 1C are a set of cross-sectional views depicting configuration examples of a semiconductor module according to an embodiment of the present invention.
Figure 1B:
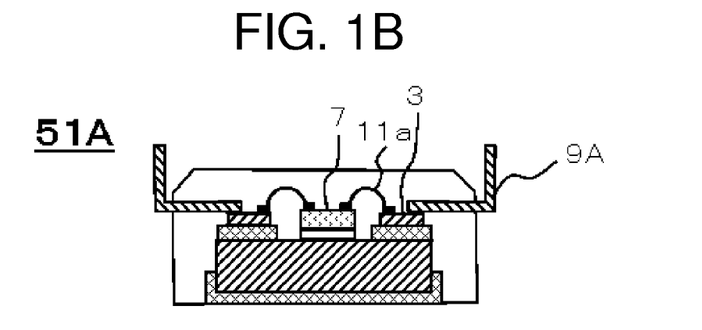
Figure 1C:
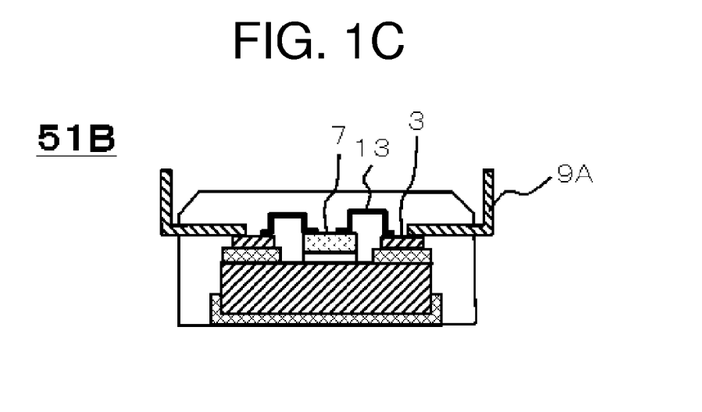

FIGS. 1A, 1B and 1C are a set of cross-sectional views depicting configuration examples of a semiconductor module according to an embodiment of the present invention, and show three types of configuration examples as FIG. 1A to FIG. 1C.

In the configuration example in FIG. 1A, a semiconductor module 51 includes: a metal block 1 that has a lower surface in the drawing, namely, a first surface 1a, and an upper surface, namely, a second surface 1b; an insulation layer 2 for heat radiation that is formed so as to cover the first surface 1a of the metal block 1 and a part of the side surfaces 1c which are connected to the first surface 1a; an insulation layer 4 for a relay electrode that is formed in a part of the second surface 1b of the metal block 1; a relay electrode 3 that is formed on the upper surface of the insulation layer 4 for the relay electrode; a power semiconductor element 7 that is bonded with the second surface 1b of the metal block 1 by solder 23; and a lead frame 9 for external connection, wherein a bonding wire 11a from the power semiconductor element 7 is bonded with the relay electrode 3, and the relay electrode 3 and the lead frame 9 for external connection are connected by a bonding wire 11b. Here the lead frame 9 for external connection functions as an external lead terminal of the semiconductor module 51. In FIGS. 1A-1C, for convenience of explanation, the bonding wire connecting the power semiconductor element 7 and the relay electrode 3 is denoted with 11a, and the bonding wire connecting the relay electrode 3 and the lead frame 9 for external connection is denoted with 11b.

In the semiconductor module 51, the metal block 1 is formed of copper, which is a metal material having good conductivity and thermal conductivity, and has a thickness of about 1.0 to 4.0 mm so that the heat capacity is high, and the heat radiation performance is superb.

In this semiconductor module 51, the insulation layer 2 for heat radiation, which is formed on the first surface 1a of the metal block 1, is made of a ceramic material having good thermal conductivity, such as aluminum oxide, silicon nitride, aluminum nitride or boron nitride. The thermal conductivity of the insulation layer 2 for heat radiation is preferably 1 to 200 W/m·K, and the thickness thereof is preferably 10 to 500 μm.

As described above, in the semiconductor module 51, the insulation layer 2 for heat radiation made of the ceramic material having good thermal conductivity is deposited on the first surface 1a of the metal block 1, on which the power semiconductor element 7 is mounted on the second surface 1b and which has high heat capacity and superb heat radiation performance, as described above, therefore the first surface 1a of the metal block 1 contacts an external heat sink for cooling (not illustrated) via the insulation layer 2 for heat radiation, whereby heat resistance of a lower area of the power semiconductor element 7 can be decreased sufficiently, and superb heat radiation performance can be implemented.

In the configuration example shown in FIG. 1, one power semiconductor element 7 is mounted on the metal block 1, but the number of the power semiconductor elements 7 mounted on the metal block 1 may be 2 or 3 or more. The metal material constituting the metal block 1 is not limited to copper, but may be, for example, copper alloy, aluminum or aluminum alloy.

In the semiconductor module 51, the insulation layer 4 for the relay electrode, which is formed on the second surface 1b of the metal block 1, is also made of a ceramic material having good thermal conductivity, such as aluminum oxide, silicon nitride, aluminum nitride or boron nitride. The thermal conductivity of the insulation layer 4 for the relay electrode is preferably 1 to 200 W/m·K, and the thickness thereof is preferably 10 to 500 μm.

The relay electrode 3, which is formed on the upper surface of the insulation layer 4 for the relay electrode, is made of a metal material having good thermal conductivity, such as copper. The metal material constituting the relay electrode 3 is not limited to copper, but may be, for example, copper alloy, aluminum or aluminum alloy.

The semiconductor module 51 is sealed by molding resin 14, such as epoxy resin.

Figure 2:
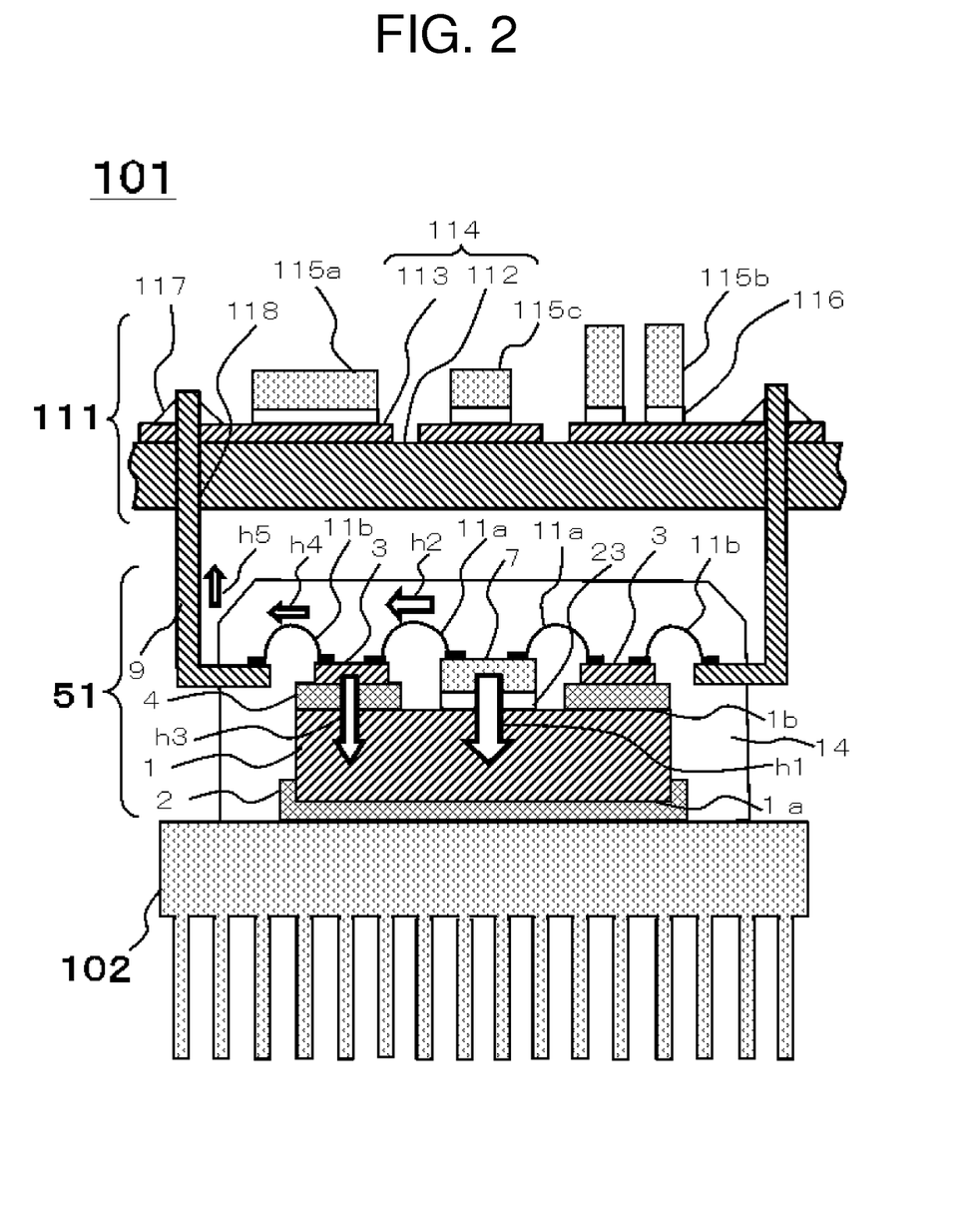
FIG. 2 is a schematic diagram depicting the flow of heat in a semiconductor module according to the embodiment of the present invention.

FIG. 2 is a schematic diagram depicting the flow of heat in the semiconductor module according to the embodiment of the present invention, and describes a particular case of incorporating the semiconductor module 51 into a power converter 101.

In FIG. 2, the semiconductor module 51 is mounted such that the insulation layer 2 for heat radiation contacts a heat sink 102 for cooling, and the lead frame 9 for external connection is connected with a printed circuit board portion 111 disposed above the semiconductor module 51, so as to constitute the power converter 101.

In the power converter 101, a main circuit is constructed by the power semiconductor element 7 in the semiconductor module 51, and the other circuits, such as a power supply circuit and a control circuit are constructed by electronic circuit components 115a, 115b, 115c or the like mounted on the printed circuit board 114 in the printed circuit board portion 111. For the electronic circuit components 115a, 115b and 115c, various components such as ICs, LSIs, resistors, capacitors and reactors are used.

The printed circuit board 114, which is partially illustrated in FIG. 2, is a printed circuit board main unit 112 on which a circuit pattern 113 is formed, and electronic circuit components 115a, 115b, 115c or the like are mounted on the printed circuit board 114 by solder 116, whereby the printed circuit board portion 111 is configured. The lead frame 9 for external connection of the semiconductor module 51 is inserted into an insertion hole 118 of the printed circuit board 114, and is bonded with the circuit pattern 113 by solder 117.

The connection structure of the semiconductor module and the printed circuit board portion according to the embodiment of the present invention is not limited to the configuration illustrated in FIG. 2.

In the semiconductor module 51 in FIG. 2, if an IGBT (Insulated Gate Bipolar Transistor) is mounted as the power semiconductor element 7, for example, a collector electrode on the lower surface of the IGBT is bonded with the second surface 1b of the metal block 1, and an emitter electrode and a gate electrode formed on the upper surface of the IGBT are connected to the relay electrode 3 respectively by the bonding wire 11a.

FIG. 2 schematically shows the flow of heat using the white arrows h1 to h5 in the case of heating when the power semiconductor element 7 is operating in the semiconductor module 51. The width of each white arrow h1 to h5 quantitatively indicates the quantity level of heat that flows through the area. FIG. 2 shows only the flow of heat that flows from the power semiconductor element 7 through the bonding wire 11a on the left. In FIG. 2, for convenience of explanation, the bonding wire connecting the power semiconductor element 7 and the relay electrode 3 is denoted with 11a, and the bonding wire connecting the relay electrode 3 and the lead frame 9 for external connection is denoted with 11b.

In FIG. 2, the heat that is generated when the power semiconductor element 7 in the semiconductor module 51 is operating is transferred from the power semiconductor element 7 to the heat sink 102 for cooling via the solder layer 23, the metal block 1 and the insulation layer 2 for radiation, and is also transferred from the power semiconductor element 7 to the lead frame 9 for external connection via the bonding wire 11a. However in the semiconductor module 51 according to the present invention, the relay electrode 3 is formed on the metal block 1 via the insulation layer 4 for the relay electrode, and the bonding wire 11a from the power semiconductor element 7 is bonded with the relay electrode 3 first, and is connected from the relay electrode 3 to the lead frame 9 for external connection via another bonding wire 11b. Therefore in the semiconductor module 51, most of the heat from the power semiconductor element 7 via the bonding wire 11a is transferred to the heat sink 102 for cooling via the relay electrode 3, insulation layer 4 for the relay electrode made of a ceramic material having good thermal conductivity, and the metal block 1, and the quantity of heat transferred from the relay electrode 3 to the lead frame 9 for external connection via the bonding wire 11b is controlled to be sufficiently low. As a consequence, the quantity of heat transferred to the printed circuit board portion 111 that is connected with the lead frame 9 for external connection of the semiconductor module 51 can be controlled, and heating of the printed circuit board 114 constituting the printed circuit board portion 111 can be effectively controlled.

In the semiconductor module 51 described above, the heat generated when the power semiconductor element 7 is operating can effectively be transferred to the metal block 1 via two heat transfer paths, as illustrated in FIG. 2, that is the first heat transfer path of the power semiconductor element 7→solder layer 23→metal block 1, and the second heat transfer path of the power semiconductor element 7→bonding wire 11a→relay electrode 3→insulation layer 4 for the relay electrode→metal block 1, hence the function of the metal block 1 of which has high heat capacity and superb heat radiation, can be more effectively demonstrated.

Figure 11:
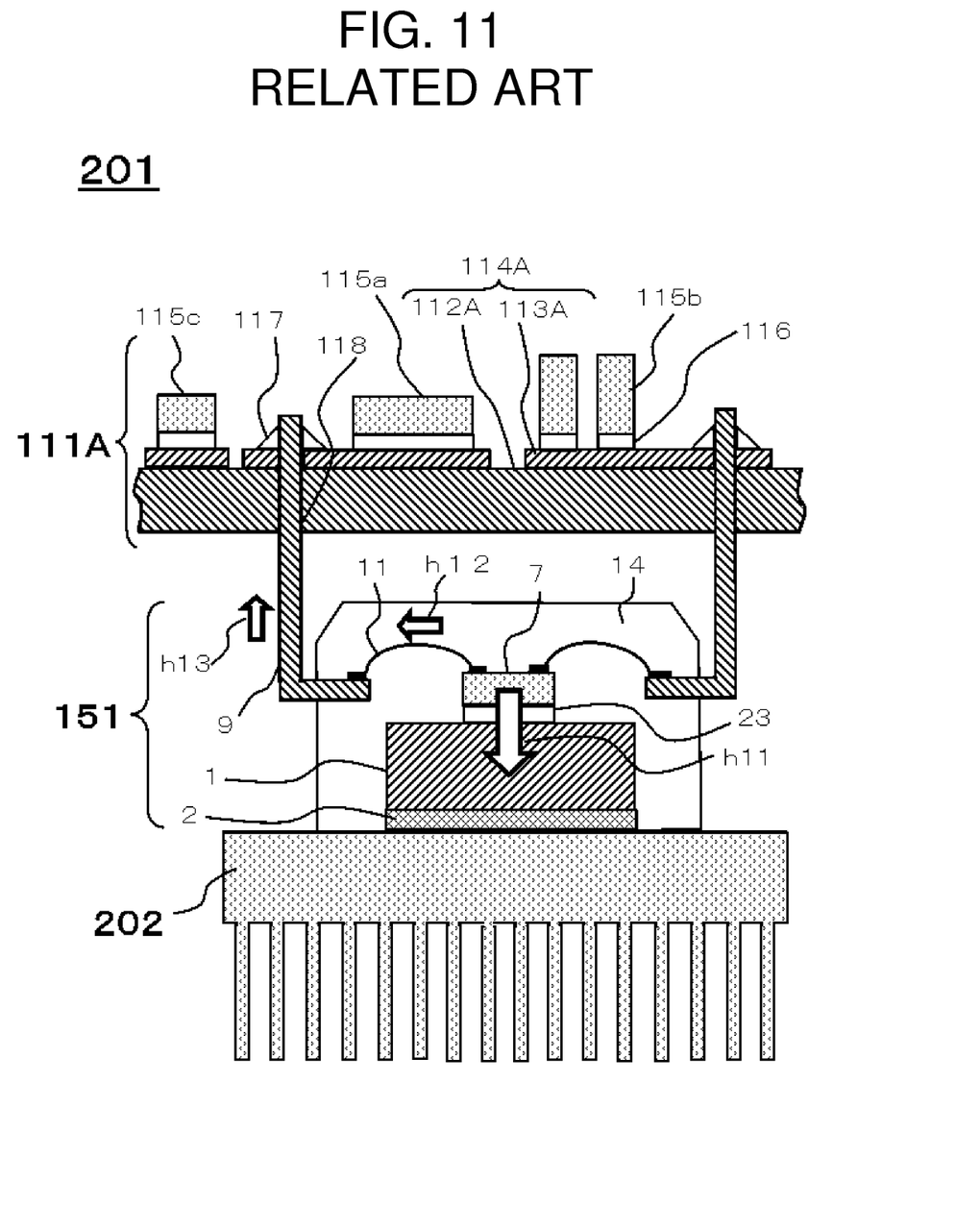
FIG. 11 is a schematic diagram depicting the flow of heat in the semiconductor module according to the related art.

FIG. 11 is a schematic diagram of a comparative example depicting the flow of heat in a semiconductor module according to the related art, where a case of using the semiconductor module having the configuration described in FIG. 10, as a semiconductor module 151 and incorporating this semiconductor module 151 into a power converter 201, is described.

In FIG. 11, the semiconductor module 151 is mounted such that the insulation layer 2 for heating radiation contacts a heat sink 202 for cooling, and the lead frame 9 for external connection is connected with a printed circuit board portion 111A disposed above the semiconductor module 151, and constitutes the power converter 201. The configuration of the printed circuit board portion 111A is the same as the printed circuit board portion 111 illustrated in FIG. 2, except that the arrangement of the circuit pattern and the electronic circuit components corresponds to the arrangement of the lead frame 9 for external connection in the semiconductor module 151. The connection structure of the semiconductor module 151 and the printed circuit board portion 111A in FIG. 11 is the same as the connection structure of the semiconductor module 51 and the printed circuit board portion 111 in FIG. 2.

FIG. 11 schematically shows the flow of heat using the white arrows h11 to h13, in the case of heating when the power semiconductor element 7 is operating in the semiconductor module 151. The width of each white arrow h11 to h13 quantitatively indicates the quantity level of heat. FIG. 11 shows only the flow of heat that flows from the power semiconductor element 7 through the bonding wire 11 on the left.

In FIG. 11, the heat that is generated when the power semiconductor element 7 in the semiconductor module 151 is operating is transferred from the power semiconductor element 7 to the heat sink 202 for cooling via the solder layer 23, the metal block 1 and the insulation layer 2 for heat radiation, and is also transferred from the power semiconductor element 7 to the lead frame 9 for external connection via the bonding wire 11.

In the semiconductor module 151 according to the related art, the bonding wire 11 from the power semiconductor element 7 is directly connected to the lead frame 9 for external connection, therefore the heat conducted from the power semiconductor element 7 via the bonding wire 11 is directly transferred to the lead frame 9 for external connection. This means that in the case of the semiconductor module 151, the quantity of heat transferred to the printed circuit board portion 111A, which is connected with the lead frame 9 for external connection of the semiconductor module 151, cannot be controlled, hence heating of the printed circuit board 114A constituting the printed circuit board portion 111A cannot be controlled.

Whereas in the case of the semiconductor module according to the present invention, in a state of being incorporated into an electric apparatus such as a power converter, as described above, the quantity of heat that is transferred to the printed circuit board portion connected to the semiconductor module, out of the heat that is generated when the power semiconductor element in the semiconductor module is operating, can be controlled, and therefore heating of the printed circuit board or the like can be effectively controlled.

Now configuration examples of FIG. 1B and FIG. 1C will be described referring to these figures again.

A semiconductor module 51A illustrated in FIG. 1B is the same as the above mentioned semiconductor module 51 illustrated in FIG. 1A, except that the relay electrode 3 and a lead frame 9A for external connection are directly bonded, instead of connecting the relay electrode 3 and the lead frame 9 for external connection via the bonding wire 11b.

A semiconductor module 51B illustrated in FIG. 1C is the same as the above mentioned semiconductor module 51A illustrated in FIG. 1B, except that the power semiconductor element 7 and the relay electrode 3 are connected via the lead frame 13, instead of connected by the bonding wire 11a.

A manufacturing method for the semiconductor module according to the embodiment of the present invention will now be described with reference to FIGS. 3A-3D, FIGS. 4A-4D and FIGS. 5A-5D. FIGS. 3A-3D, FIGS. 4A-4D and FIGS. 5A-5D are cross-sectional views depicting a structure at each stage of the manufacturing steps of the semiconductor module according to the embodiment of the present invention, and the semiconductor module 51 illustrated in FIG. 1A in particular will now be described.

Figure 3A:
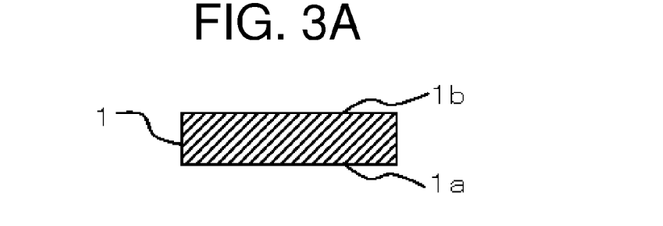
FIGS. 3A, 3B, 3C and 3D are a set of cross-sectional views depicting a structure in each stage of the manufacturing steps of the semiconductor module according to the embodiment of the present invention.

First a copper plate with a 1.0 to 4.0 mm thickness is punched out into a square or rectangular shape by pressing, so as to create a metal block 1 (FIG. 3A).

Then a mask 21 is positioned and ceramic powder 22, such as aluminum oxide powder, is deposited by a spraying method or aerosol deposition method, so as to form the insulation layer 2 for heat radiation on the first surface 1a of the metal block 1.

For the insulation layer 2 for heat radiation, a first surface insulation layer 2a is formed on the first surface 1a of the metal block 1, and a side surface insulation layer 2b is formed on a part of the side surfaces 1c of the metal block 1. The side surface insulation layer 2b is formed so as to be connected with the first surface insulation layer 2a (FIG. 3B to FIG. 3C).

If the insulation layer is formed on the first surface 1a of the metal block 1 using a plasma spraying method, which is one spraying method, then one or more type(s), out of silicon oxide, aluminum oxide, silicon nitride, aluminum nitride and boron nitride, is(are) used for the ceramic powder. The insulation layer 2 for heat radiation is deposited by spraying the ceramic powder on the metal block 1 via the mask 21 in an air pressure or reduced pressure atmosphere.

Figure 3B:
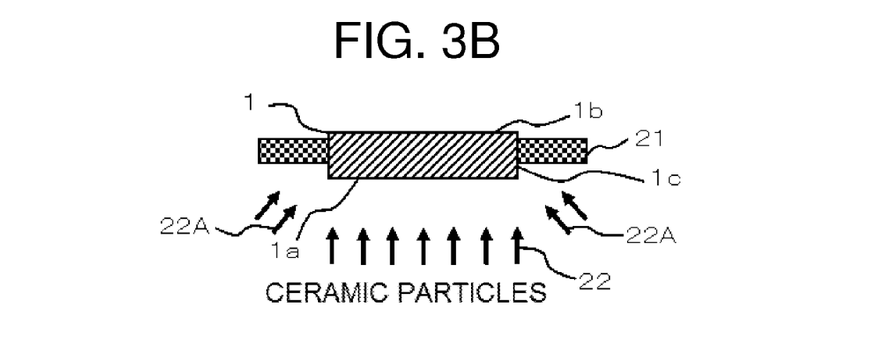
Figure 3C:
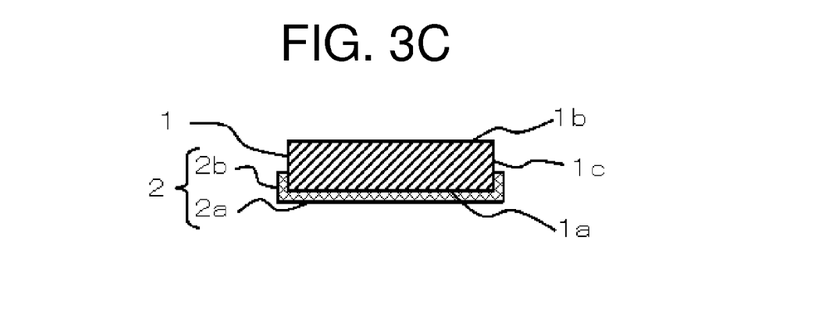
Figure 3D:
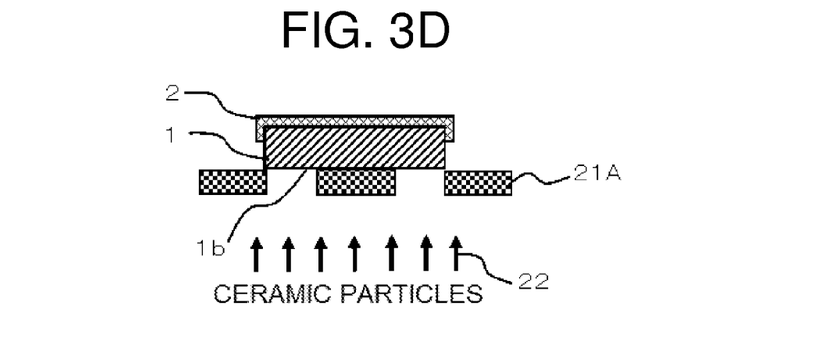

As the insulation layer 2 for heat radiation, not only the first surface insulation layer 2a but also the side surface insulation layer 2b is formed on the metal block 1 by a plasma spraying method, therefore as illustrated in FIG. 3B, the ceramic powder is sprayed as raw material powders 22 and 22A in a state where a part of the side surface 1c of the metal block 1 is exposed from the mask 21, as illustrated in FIG. 3B for example. At this time, the direction of a spraying nozzle (not illustrated) is adjusted so that the raw material powder 22A sprayed in the diagonal direction is used, in addition to the raw material powder 22 sprayed in the direction facing the first surface 1a of the metal block 1, whereby not only the first surface insulation layer 2a on the first surface 1a but also the side surface insulation layer 2b, which is connected to the first surface insulation layer 2a, is formed on a part of the side surface 1c on the metal block 1. The range of the side surface 1c of the metal block 1, that is covered by the side surface insulation layer 2b, is determined considering the insulation design conditions, such as the potential difference generated between the metal block 1 and an external heat sink for cooling (not illustrated).

The thickness of the insulation layer 2 for heat radiation can be adjusted by controlling the spraying time. The thickness of the insulation layer is preferably 10 to 500 μm. The insulation layer 2 for heat radiation that is formed like this has, for example, a 5 kV or more AC breakdown voltage at a 200 μm thickness as an insulation characteristic, and can therefore be used for a power element of which withstand voltage rating is 1200 V.

Now a case of depositing the insulation layer 2 for heat radiation on the first surface 1a of the metal block 1 by an aerosol deposition method will be described. The aerosol deposition method is a technique of aerosolizing particles or raw material of ultrafine particles mixing with gas and forming a film on a substrate via a nozzle. Helium or air is used for the gas. The apparatus can be constituted by an aerosolization chamber and a film deposition chamber (not illustrated). In the film deposition chamber, pressure is reduced to about 50 Pa to 1 kPa by a vacuum pump. The particle or ultrafine particle material, which is a raw material, is aerosolized by being stirred and mixed with gas in the aerosolization chamber in a dry state, transported into the film deposition chamber by the flow of gas that is generated due to the pressure difference between these chambers, accelerated while passing through a slit type nozzle, and sprayed onto the first surface 1a of the metal block 1, which is a film deposition target. For the raw material particles, mechanically pulverized ceramic particles (particle diameter: 0.1 to 2 μm) are used. The ultrafine particles which are transported by gas are accelerated to several hundred m/sec. while moving through the nozzle having a micro-opening in the pressure-reduced chamber. The film depositing speed and the density of the depositing film depend considerably on the particle diameter, the aggregation state, the drying state or the like of the ceramic particles that are used, hence a grinder and a classifier of aggregated particles is used between the aerosolization chamber and the film deposition chamber.

To form the insulation layer 2 for heat radiation as a film, ceramic particles (particle diameter: 0.1 to 2 μm) are sprayed on the substrate at high-speed, so that the ceramic particles are pulverized into fine crystal particles (about 10 to 30 nm) by the collision energy at this time, whereby a new surface is formed and activated, particles are bonded to each other, and as a result a ceramic film having a dense nanocrystal structure is formed. In the aerosol deposition method, the ceramic film can be formed under normal temperature without requiring special heating.

For the particles used for the aerosol deposition, it is preferable to use any one of aluminum oxide, silicon nitride, aluminum nitride and boron nitride, of which particle diameters are about 0.1 to 2 μm. To acquire the required film thickness, particles are sprayed for a predetermined time using the mask 21, whereby the insulation layer 2 for heat radiation, illustrated in FIG. 3C, is formed.

As the insulation layer 2, not only the first surface insulation layer 2a but also the side surface insulation layer 2b is formed on the metal block 1 by the aerosol deposition method, therefore just like the case of the above mentioned plasma spraying method, the ceramic particles are sprayed as the raw material powders 22 and 22A in a state where a part of the side surface 1c of the metal block 1 is exposed from the mask 21, as illustrated in FIG. 3B, for example. At this time, the direction of a nozzle (not illustrated) is adjusted so that the raw material powder 22A sprayed in the diagonal direction is used, in addition to the raw material powder 22 sprayed in the direction facing the first surface 1a of the metal block 1, whereby not only the first surface insulation layer 2a on the first surface 1a, but also the side surface insulation layer 2b, which is connected to the first surface insulation layer 2a, is formed on a part of the side surface 1c on the metal block 1. The range of the side surface 1c of the metal block 1, that is covered by the side surface insulation layer 2b, is determined considering the insulation design conditions, such as the potential difference generated between the metal block 1 and an external heat sink for cooling (not illustrated).

Here an aluminum oxide film may be formed with filler of any one of silicon nitride, aluminum nitride and boron nitride particles, or a silicon oxide film may be formed with filler of any one of silicon nitride, aluminum nitride and boron nitride particles. If these particles are used, the insulation layer in which two or more types of ceramics are combined can be formed.

The thickness of the insulation layer 2 for heat radiation is preferably 10 to 500 μm, just like the case of the spraying method. The insulation layer 2 formed like this has, for example, 5 kV or more of AC breakdown voltage at a 200 μm thickness as the insulation characteristic, therefore this layer can be used for a power element of which withstand voltage rating is 1200 V.

Then a mask 21A is also positioned on the second surface 1b of the metal block 1, and ceramic powder 22, such as aluminum oxide powder, is deposited by a spraying method or an aerosol deposition method, so as to form the insulation layer 4 for the relay electrode on the second surface 1b of the metal block 1 (FIG. 3D to FIG. 4A). The insulation layer 2 for the relay electrode is not formed on the entire surface, but on a part of the second surface 1b of the metal block 1.

The materials of the ceramic particles used for forming the insulation layer 4 for the relay electrode and the method of forming the insulation layer are the same as the above mentioned insulation layer 2 for heat radiation, for both cases of the spraying method and the aerosol deposition method.

The thickness of the insulation layer 2 for the relay electrode is preferably 10 to 500 μm, just like the insulation layer 2 for heat radiation, whether the spraying method or the aerosol deposition method is used.

Figure 4A:
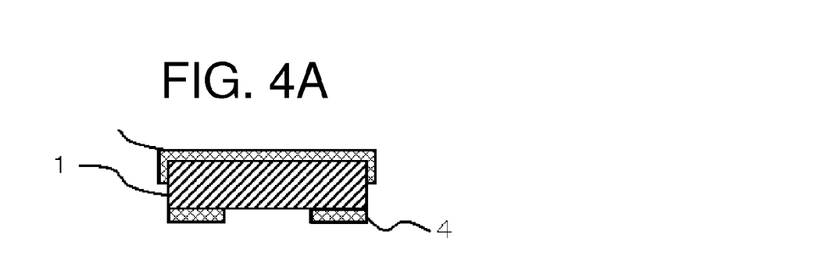
FIGS. 4A, 4B, 4C and 4D are a set of cross-sectional views depicting a structure in each stage of the manufacturing steps of the semiconductor module according to the embodiment of the present invention.
Figure 4B:
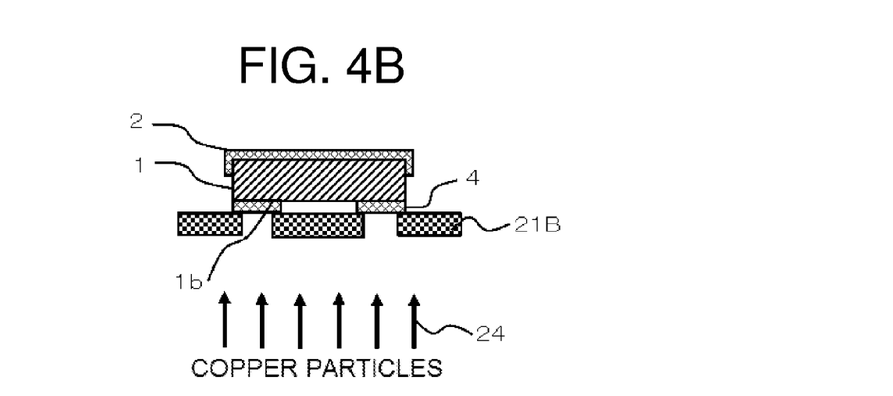
Figure 4C:
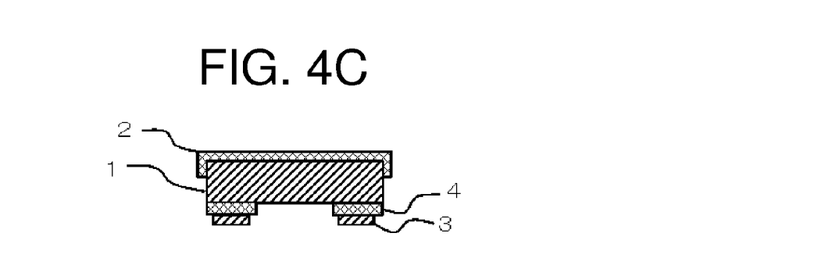

Then the relay electrode 3 (made of copper) is deposited on the insulation layer 4 for the relay electrode. To deposit copper, the plasma spraying method is used, just like the case of the insulation layer for heat radiation. In other words, the mask 21B is positioned on the insulation layer 4 for the relay electrode formed on the second surface 1b of the metal block 1, and copper particles 24 are sprayed to form the relay electrode 3 (FIG. 4B and FIG. 4C).

Figure 4D:
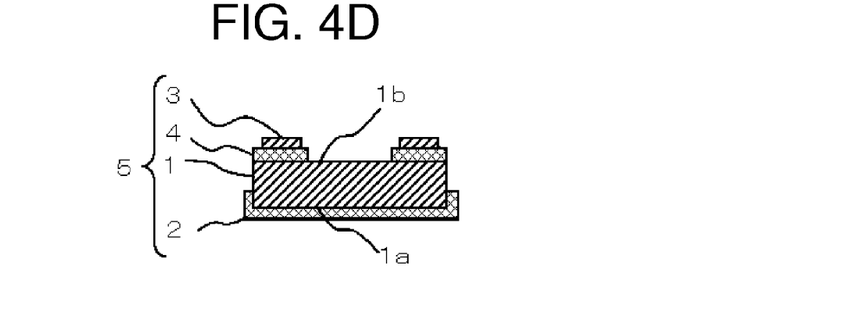

As a result, the insulation layer 2 for heat radiation is formed on the first surface 1a of the metal block 1, and the relay electrode 3 is formed on a part of the second surface 1b via the insulation layer 4 for the relay electrode, whereby an insulated metal block 5 is completed (FIG. 4D).

Figure 5A:
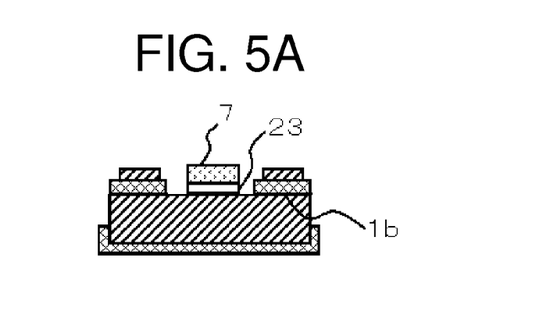
FIGS. 5A, 5B, 5C and 5D are a set of cross-sectional views depicting a structure in each stage of the manufacturing steps of the semiconductor module according to the embodiment of the present invention.

Then the power semiconductor element 7 is bonded with the second surface 1b of the metal block 1 of the insulated metal block 5 by solder 23 (FIG. 5A). Soldering is performed in a furnace where hydrogen reduction is possible, using pellet type solder. A furnace where hydrogen reduction is possible is used so that wettability with the solder is improved by removing the oxide film on the surface of the metal block 1 by hydrogen reduction and activating the surface. The solder material used here is a high temperature solder formed of SnPbAg, or lead-free solder formed of a material in the SnAgCu family. The soldering temperature is set according to the melting point of the respective solder.

If a void remains in the solder layer 23 between the power semiconductor element 7 and the metal block 1, the thermal resistance increases, and the heat generated from the power semiconductor element 7 cannot be efficiently radiated. Therefore to prevent the generation of a void, vacuuming to 1.3 kPa (10 Torr) or less is performed in a state where solder is melted.

Figure 5B:
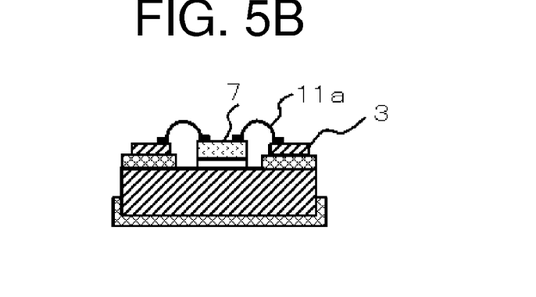

Then the power semiconductor element 7 and the relay electrode 3 are connected via the bonding wire 11a (FIG. 5B).

The bonding wire 11a is bonded by ultrasonic bonding using an Al wire, of which wire diameter is 125 to 500 μm. To connect the power semiconductor element 7 and the relay electrode 3, the lead frame 13, as illustrated in FIG. 1C, may be used instead of the bonding wire 11a.

Figure 5C:
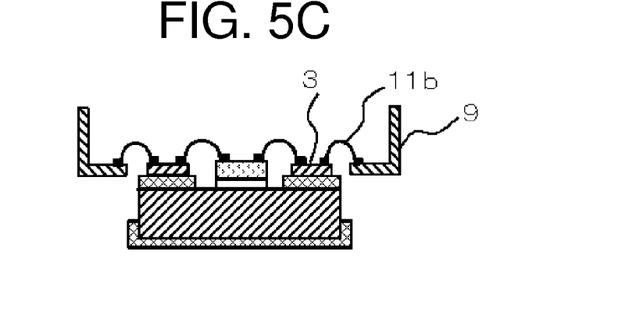

Then the relay electrode 3 and the external lead terminal 9 are connected via the bonding wire 11b (FIG. 5C). The bonding wire 11b is bonded by ultrasonic bonding using an Al wire of which wire diameter is 125 to 500 μm, just like the above mentioned bonding wire 11a. To connect the relay electrode 3 and the lead frame 9 for external connection, a lead frame similar to the lead frame 13, illustrated in FIG. 1C, may be used instead of the bonding wire 11b, or the lead frame 9 for external connection may be directly bonded to the relay electrode 3, as illustrated in FIG. 1B and FIG. 1C.

Then the assembly illustrated in FIG. 5C is set in a metal mold installed in a transfer molder. The metal mold is kept at a 170° C. to 180° C. temperature, and after preheating, a tablet type epoxy resin 14 is filled into the metal mold using a plunger. The epoxy resin 14 is constituted by epoxy resin that includes at least one out of a filler group consisting of silicon oxide, aluminum oxide, silicon nitride, aluminum nitride and boron nitride, and has a thermal conductivity of 0.5 to 5 W/m·K.

Figure 5D:
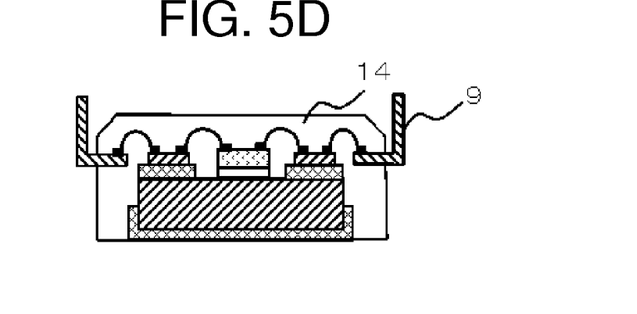

Since the epoxy resin 14 is cured in several tens of seconds once it is filled in, the epoxy resin 14 is immediately removed from the metal mold, and sealing is completed by performing post-curing in a thermostatic chamber (FIG. 5D).

Figure 6A:
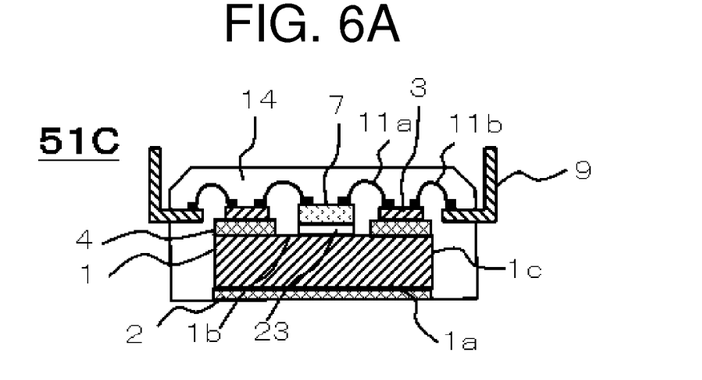
FIGS. 6A, 6B and 6C are a set of cross-sectional views depicting different configuration examples of the semiconductor module according to an embodiment of the present invention.
Figure 6B:
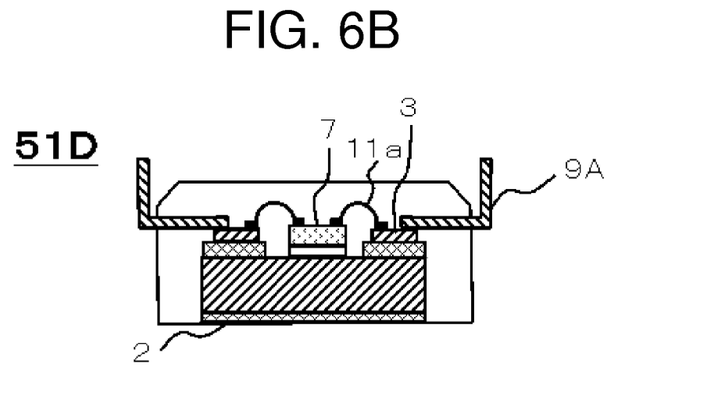
Figure 6C:
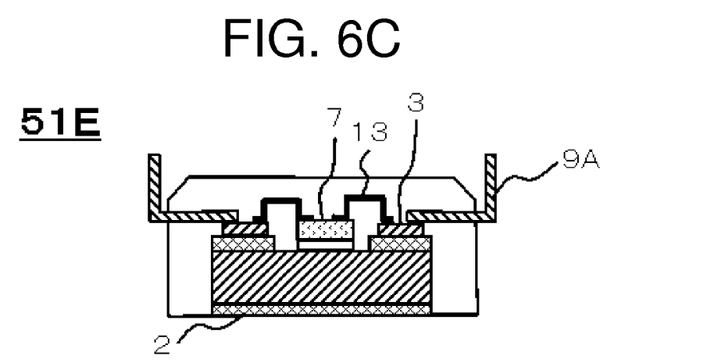

FIGS. 6A, 6B and 6C are a set of cross-sectional views depicting different configuration examples of the semiconductor module according to an embodiment of the present invention. In the semiconductor module of this invention, if there are no problems with insulation design conditions, such as a potential difference that could be generated between the metal block 1 and an external heat sink for cooling (not illustrated), then a configuration of the insulation layer 2 for heat radiation that is formed only on the first surface may be used, just like the semiconductor modules 51C, 51D and 51E illustrated in FIG. 6A to FIG. 6C. Each configuration of the semiconductor modules 51C, 51D and 51E corresponds to each configuration of the semiconductor modules 51, 51A and 51B illustrated in FIG. 1A to FIG. 1C respectively.

In the above described semiconductor module according to the present invention, the bonding wire or the lead frame from a circuit element, such as a power semiconductor element bonded with the second surface of the metal block, is bonded with the relay electrode first, and then the relay electrode and the external lead terminal are connected. Therefore heat that is generated when the circuit element is operating, and is transferred through the bonding wire or the lead frame from the circuit element, is conducted to the metal block, which has a high heat capacity and is superb in heat radiation performance, mainly via the relay electrode and the insulation layer for the relay electrode made of ceramic material having good thermal conductivity, hence the quantity of heat conducted to the external lead terminal can be sufficiently controlled.

As a consequence, in the semiconductor module according to the present invention, the quantity of heat that is conducted from the external lead terminal to the printed circuit board, for example, which is externally connected to the external lead terminal, can be effectively controlled, and therefore the heating of the external printed circuit board can be effectively controlled. This means that by using this semiconductor module, an increase in temperature inside the case of the power converter can be effectively controlled without increasing the dimensions and cost of the power converter.

EXPLANATION OF REFERENCE NUMERALS AND SYMBOLS 1 metal block
1a first surface
1b second surface
1c side surface
2 insulation layer for heat radiation
2a first surface insulation layer
2b side surface insulation layer
3 relay electrode
4 insulation layer for relay electrode
5 insulation metal block
7 power semiconductor element
9, 9A, 9B, 9C, 9D, 9E, 9F lead frame for external connection
11, 11a, 11b bonding wire
12 bonding wire for IC
13 lead frame
14 molding resin (epoxy resin)
21, 21A, 21B mask
22, 22A ceramic particles
23 solder
24 copper particles
31 drive IC
32 heat sink
33 insulation substrate
34 metal plate
35 copper foil
36 insulation layer
37 insulated metal block
51, 51A, 51B, 51C, 51D, 51E semiconductor module
101 power converter
102 heat sink for cooling
111, 111A printed circuit board portion
112, 112A printed circuit board main unit
113, 113A circuit pattern
114, 114A printed circuit board
115a, 115b, 115c electronic circuit component
116 solder
117 solder
118 insertion hole
151 semiconductor module
201 power converter
202 heat sink for cooling
h1, h2, h3, h4, h5, h11, h12, h13 flow of heat

What is claimed is:

1. A semiconductor module, comprising:
a metal block that has a first surface and a second surface;
an insulation layer for heat radiation formed by directly depositing a ceramic material on at least the first surface of the metal block;
an insulation layer for a relay electrode, formed by directly depositing a ceramic material on a part of the second surface of the metal block;
a relay electrode formed by depositing a metal material on an upper surface of the insulation layer for the relay electrode;
a circuit element bonded with the second surface of the metal block; and
an external lead terminal, wherein
a bonding wire or a lead frame from the circuit element is bonded with the relay electrode, and
the relay electrode and the external lead terminal are connected.

2. The semiconductor module according to claim 1, wherein
the insulation layer for heat radiation covers at least a part of side surfaces connected to the first surface of the metal block.

3. The semiconductor module according claim 2, wherein a heat sink for cooling is formed on a lower surface of the insulation layer for heat radiation.

4. The semiconductor module according to claim 1, wherein
the insulation layer for heat radiation and the insulation layer for the relay electrode each have a thermal conductivity of 1 to 200 W/m·K and a thickness of 10 to 500 µm.

5. The semiconductor module according claim 4, wherein a heat sink for cooling is formed on a lower surface of the insulation layer for heat radiation.

6. The semiconductor module according to claim 1, wherein
the insulation layer for heat radiation and the insulation layer for the relay electrode are each formed of at least one type out of a filler group consisting of silicon oxide, aluminum oxide, silicon nitride, aluminum nitride and boron nitride.

7. The semiconductor module according to claim 6, wherein
the insulation layer for heat radiation and the insulation layer for the relay electrode are each formed by depositing ceramic particles composed of at least one type out of the filler group by a plasma spraying method.

8. The semiconductor module according claim 7, wherein a heat sink for cooling is formed on a lower surface of the insulation layer for heat radiation.

9. The semiconductor module according to claim 6, wherein
the insulation layer for heat radiation and the insulation layer for the relay electrode are each formed by depositing ceramic particles composed of at least one type out of the filler group by an aerosol deposition method.

10. The semiconductor module according claim 9, wherein a heat sink for cooling is formed on a lower surface of the insulation layer for heat radiation.

11. The semiconductor module according claim 6, wherein a heat sink for cooling is formed on a lower surface of the insulation layer for heat radiation.

12. The semiconductor module according to claim 1, wherein
the relay electrode is formed by spraying copper particles as the metal material.

13. The semiconductor module according to claim 1, wherein
the relay electrode and the external lead terminal are connected via a bonding wire or a lead frame.

14. The semiconductor module according to claim 1, wherein
the circuit element is a power semiconductor element.

15. The semiconductor module according claim 1, wherein a heat sink for cooling is formed on a lower surface of the insulation layer for heat radiation.

16. A semiconductor device, comprising:
a block;
a circuit element on the block;
a relay element on the block;
an insulation layer between the relay element and a surface of the block; and
an external lead terminal;
wherein the circuit element is connected to the external lead terminal via the relay element.

17. The semiconductor device of claim 16,
further comprising a heat radiation layer on an opposite surface of the block.

18. The semiconductor device of claim 17, wherein the heat radiation layer covers the opposite surface of the block and a portion of side surfaces of the block.

19. The semiconductor device of claim 18,
wherein the circuit element is connected to the relay element by a bonding wire or a lead frame.

* * * * *